United States Patent
Kim et al.

(10) Patent No.: US 10,535,394 B2
(45) Date of Patent: Jan. 14, 2020

(54) MEMORY DEVICE INCLUDING DYNAMIC VOLTAGE AND FREQUENCY SCALING SWITCH AND METHOD OF OPERATING THE SAME

(71) Applicant: SAMSUNG ELECTRONICS CO., LTD., Suwon-si, Gyeonggi-do (KR)

(72) Inventors: Young-Hwa Kim, Seongnam-si (KR); Tae-Young Oh, Seoul (KR); Jin-Hun Jang, Uiwang-si (KR); Kyung-Soo Ha, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/039,404

(22) Filed: Jul. 19, 2018

(65) Prior Publication Data
US 2019/0027207 A1 Jan. 24, 2019

(30) Foreign Application Priority Data

Jul. 20, 2017 (KR) .................. 10-2017-0092261
Jul. 10, 2018 (KR) .................. 10-2018-0079958

(51) Int. Cl.
  *G11C 11/4074* (2006.01)
(52) U.S. Cl.
  CPC ................ *G11C 11/4074* (2013.01)
(58) Field of Classification Search
  CPC .................. G11C 5/147; G11C 7/00
  USPC ......................... 365/226, 189.011
  See application file for complete search history.

(56) References Cited

U.S. PATENT DOCUMENTS

| 5,886,561 | A | 3/1999 | Eitan et al. | |
| 6,269,033 | B1 * | 7/2001 | Ishida | G11C 29/848 |
| | | | | 365/189.06 |
| 6,417,793 | B1 * | 7/2002 | Bugeja | H03M 1/0872 |
| | | | | 341/143 |
| 6,501,671 | B2 * | 12/2002 | Konishi | G11C 5/14 |
| | | | | 327/530 |

(Continued)

FOREIGN PATENT DOCUMENTS

| KR | 100152354 B1 | 10/1998 |
| KR | 1020070109429 A | 11/2007 |

(Continued)

OTHER PUBLICATIONS

Office Action From Singapore Patent Office Corresponding to Application SG 10201804015P, dated Feb. 19, 2019.

(Continued)

*Primary Examiner* — Michael T Tran
(74) *Attorney, Agent, or Firm* — Volentine, Whitt & Francos, PLLC

(57) ABSTRACT

A memory device includes a first switch for switching a first power voltage and transmitting the first power voltage to a common node of a first power rail. A second switch switches a second power voltage and transmits the second power voltage to the common node. A control logic generates a first control signal for controlling the first switch during initial driving of the memory device. A masking circuit controls the first switch to maintain a turn on state in at least a partial period of the initial driving period of the memory device by providing a first masking control signal obtained by masking the first control signal to the first switch.

20 Claims, 12 Drawing Sheets

(56) References Cited

U.S. PATENT DOCUMENTS

| | | | |
|---|---|---|---|
| 6,553,496 B1* | 4/2003 | Buer | G06F 21/55 327/18 |
| 7,213,160 B2* | 5/2007 | Obara | G06F 1/3209 713/310 |
| 7,389,437 B2* | 6/2008 | Hashidate | G06F 1/3203 327/108 |
| 7,782,701 B2 | 8/2010 | Seo et al. | |
| 8,374,001 B2* | 2/2013 | Huang | H02M 3/33507 363/21.01 |
| 8,415,972 B2 | 4/2013 | Rogers et al. | |
| 8,823,209 B2* | 9/2014 | Tatsumi | G06F 1/3203 307/41 |
| 8,971,097 B2 | 3/2015 | Ngo et al. | |
| 9,337,660 B1 | 5/2016 | Bourstein | |
| 9,531,279 B2* | 12/2016 | Mao | H02M 3/33523 |
| 9,654,101 B2* | 5/2017 | Cao | H03K 19/0016 |
| 9,710,041 B2 | 7/2017 | Gendler et al. | |
| 9,793,798 B1* | 10/2017 | de Cremoux | H02M 3/157 |
| 9,806,614 B2* | 10/2017 | Dash | G01R 19/175 |
| 9,842,859 B2* | 12/2017 | Koyama | H01L 27/1248 |
| 9,847,107 B2 | 12/2017 | Seo et al. | |
| 9,852,859 B2* | 12/2017 | Cao | H03K 19/0008 |
| 9,898,070 B2* | 2/2018 | Tsuji | G06F 1/3243 |
| 9,953,784 B2* | 4/2018 | Kitora | H01H 47/00 |
| 9,960,705 B1* | 5/2018 | Pidutti | H02M 7/217 |
| 9,960,769 B2 | 5/2018 | Kapoor | |
| 9,977,480 B2* | 5/2018 | Kolla | G06F 1/3234 |
| 10,033,297 B2* | 7/2018 | Pidutti | H01L 29/7395 |
| 10,050,448 B2* | 8/2018 | Kolla | H02J 4/00 |
| 10,236,589 B2* | 3/2019 | Legay | H01Q 25/008 |
| 10,261,557 B2* | 4/2019 | Kim | G06F 1/266 |
| 2002/0135419 A1* | 9/2002 | Groves, Jr. | H03F 3/2173 330/10 |
| 2008/0018381 A1 | 1/2008 | Shin | |
| 2008/0211570 A1 | 9/2008 | Wang et al. | |
| 2010/0005439 A1 | 1/2010 | Shikata | |
| 2010/0244942 A1 | 9/2010 | Okano | |
| 2012/0117391 A1 | 5/2012 | Jacquet et al. | |
| 2014/0195718 A1* | 7/2014 | Abraham | G06F 9/00 711/103 |
| 2014/0301259 A1 | 10/2014 | Homchaudhuri et al. | |
| 2014/0313819 A1 | 10/2014 | Choi et al. | |
| 2015/0009751 A1 | 1/2015 | Kulkarni et al. | |
| 2015/0036446 A1 | 2/2015 | Kenkare et al. | |
| 2015/0041955 A1* | 2/2015 | Zerbe | H01L 23/49816 257/532 |
| 2015/0340073 A1 | 11/2015 | Seo et al. | |
| 2016/0036434 A1 | 2/2016 | Hara et al. | |
| 2016/0054776 A1 | 2/2016 | Lu et al. | |
| 2016/0094121 A1 | 3/2016 | Cowley et al. | |
| 2016/0111134 A1 | 4/2016 | Kim et al. | |
| 2016/0179164 A1* | 6/2016 | Park | G06F 1/324 713/322 |
| 2016/0277020 A1* | 9/2016 | Marschalkowski | G06F 1/324 |
| 2016/0285639 A1* | 9/2016 | Mathew | H04L 9/3278 |
| 2016/0306412 A1 | 10/2016 | Kolla et al. | |
| 2016/0320821 A1* | 11/2016 | Mair | G06F 1/3296 |
| 2016/0349827 A1 | 12/2016 | Idgunji et al. | |
| 2017/0038814 A1* | 2/2017 | Pal | G06F 1/08 |
| 2017/0075401 A1 | 3/2017 | Choi et al. | |
| 2017/0083067 A1* | 3/2017 | Ganor | G06F 1/26 |
| 2017/0147053 A1 | 5/2017 | Chang et al. | |
| 2017/0147727 A1* | 5/2017 | Bickford | G06F 17/5045 |
| 2017/0169875 A1 | 6/2017 | Gans | |
| 2017/0194483 A1 | 7/2017 | Ng et al. | |
| 2017/0194957 A9 | 7/2017 | Simmonds | |
| 2017/0338661 A1* | 11/2017 | Marchya | H02J 4/00 |
| 2017/0351315 A1* | 12/2017 | Ochoa Munoz | G06F 1/324 |
| 2018/0095514 A1* | 4/2018 | Man | G06F 1/28 |
| 2018/0115238 A1* | 4/2018 | Bulzacchelli | G05F 1/00 |
| 2018/0164870 A1* | 6/2018 | Gendler | G06F 1/3275 |
| 2018/0164873 A1* | 6/2018 | Gendler | G06F 1/3296 |
| 2018/0254732 A1* | 9/2018 | Smolenaers | H02J 7/022 |

FOREIGN PATENT DOCUMENTS

| | | |
|---|---|---|
| WO | 106873696 A | 6/2017 |
| WO | WO2017098211 A1 | 6/2017 |

OTHER PUBLICATIONS

European Search Report Cited in EP18184828 dated Mar. 8, 2019.
Office Action From Intellectual Property Office of Singapore Cited in Singaporean Application 10201806160Y, dated Jan. 8, 2019.
Office Action From European Patent Office Corresponding to Application EP 18184829.2-1216 / 3454173, dated Mar. 13, 2019.

* cited by examiner

FIG. 2
VDD1 ──────────────
VDD2H ─────────────
VDD2L ─────────────
VINT ──────────────
VPWR_INT ──────────
VPWR_2H ───────────
FIG. 3A
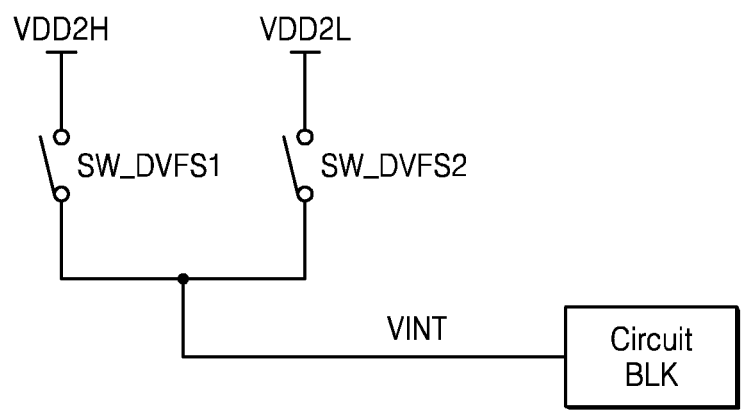
FIG. 3B
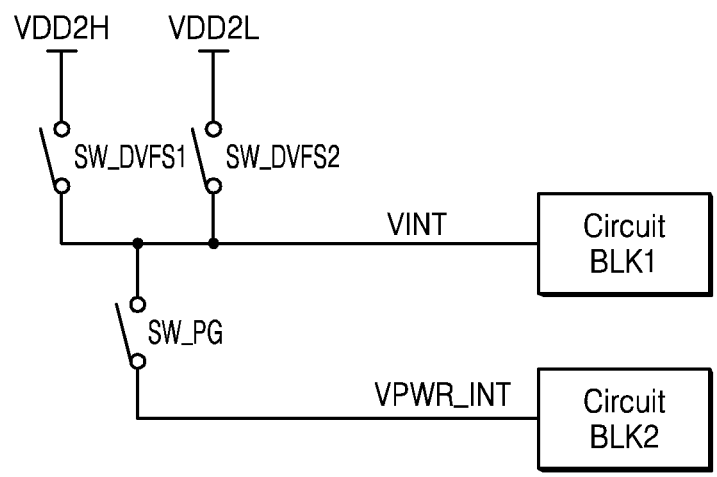

MEMORY DEVICE INCLUDING DYNAMIC VOLTAGE AND FREQUENCY SCALING SWITCH AND METHOD OF OPERATING THE SAME

CROSS-REFERENCE TO RELATED APPLICATION

This application claims the benefit of Korean Patent Application No. 10-2017-0092261, filed on Jul. 20, 2017, in the Korean Intellectual Property Office, the disclosure of which is incorporated herein in its entirety by reference.

BACKGROUND

The disclosure relates to a memory device, and more particularly, to a memory device including a dynamic voltage and frequency scaling (DVFS) switch and a method of operating the same.

A capacity and speed of a semiconductor memory device widely used in a high performance electronic system are increasing. As an example of the semiconductor memory device, dynamic random-access memory (DRAM) is a volatile memory and determines data by charges stored in a capacitor.

DRAM may perform internal operations by using various levels of power voltages. In addition, as a dynamic voltage and frequency scaling (DVFS) technique is applied, the power voltages and an operation frequency may be controlled in various operation modes of the DRAM. In addition, for power voltage management, the DRAM may include a plurality of power rails and switches connected to the power rails. In accordance with a connection structure of switches, a common node (or a short node) to which two power voltages are connected may exist. At this time, during initial driving of the DRAM, before a level of a power voltage is stabilized, an erroneous operation of switching may occur. In addition, as peak current flows to the common node, there is a probability of element damage.

SUMMARY

The disclosure describes a memory device capable of reducing a probability of performance deterioration and circuit damage that are caused by generation of a peak current or a reverse current during an initial operation of the memory device and a method of operating the same.

According to an aspect of the disclosure, there is provided a memory device including a first switch for switching a first power voltage and transmitting the first power voltage to a common node of a first power rail, a second switch for switching a second power voltage and transmitting the second power voltage to the common node, a control logic for generating a first control signal for controlling the first switch during initial driving of the memory device, and a masking circuit arranged to correspond to the first switch to control switching so that the first switch maintains a turn on state in at least a partial period of the initial driving period of the memory device by providing a first masking control signal obtained by masking the first control signal to the first switch.

According to another aspect of the disclosure, there is provided a memory device that receives a first power voltage VDD1, a second high-power voltage VDD2H, and a second low-power voltage VDD2L in accordance with a low power double data rate (LPDDR) specification. The memory device includes a first dynamic voltage and frequency scaling (DVFS) switch connected between a first power rail for transmitting the second high-power voltage VDD2H and a second power rail for transmitting at least two power voltages in accordance with a DVFS function, a second DVFS switch connected between a third power rail for transmitting the second low-power voltage VDD2L and the second power rail, and a masking circuit for receiving a first DVFS control signal for controlling the first DVFS switch in an initial driving period of the memory device, masking the first DVFS control signal, and providing a first masking DVFS control signal for turning on the first DVFS switch in the initial driving period to the first DVFS switch.

According to an aspect of the disclosure, a method of operating a memory device includes generating a first DVFS control signal for controlling a first DVFS switch in an initial driving period of the memory device, generating a first internal control signal used for masking a first DVFS control signal in the initial driving period, generating a first masking DVFS control signal for uniformly maintaining a first logic state by performing an operation on the first DVFS control signal and the first internal control signal, and maintaining a turn on state of the first DVFS switch in the initial driving period in response to the first masking DVFS control signal. The memory device receives a first power voltage VDD1, a second high-power voltage VDD2H, and a second low-power voltage VDD2L in accordance with a low power double data rate (LPDDR) specification and the memory device includes a first DVFS switch for transmitting the second high-power voltage VDD2H to a first power rail and a second DVFS switch for transmitting the second low-power voltage VDDD2L to the first power rail.

According to an aspect of the disclosure, there is provided a memory device having a memory cell that is powered by a first power voltage or a second power voltage. A first switch conveys, during a powered mode of operation for the memory device, the first power voltage to a power rail when activated by a first state of a first control signal and does not convey the first power voltage to the power rail when deactivated by a second state of the first control signal. A masking circuit overrides, during a powering-up mode of operation for the memory device, an ability of the first control signal to activate or deactivate the first switch and activates the first switch.

In a memory device according to the disclosure and a method of operating the same, in an initial driving period of a memory device, it is possible to reduce a leakage current and an element damage probability by reducing a peak current caused by switching of a dynamic voltage and frequency scaling (DVFS) switch and a reverse current generating probability in accordance with an unstable state of the DVFS switch, and it is possible to prevent a power short.

BRIEF DESCRIPTION OF THE DRAWINGS

Embodiments of the disclosure will be more clearly understood from the following detailed description taken in conjunction with the accompanying drawings in which:

FIG. 2 is a view illustrating an example of power rails arranged in dynamic random access memory (DRAM);

FIGS. 3A and 3B are circuit diagrams illustrating an example of a switching operation in accordance with a dynamic voltage and frequency scaling (DVFS) technique;

DETAILED DESCRIPTION OF THE EMBODIMENTS

Figure 1:
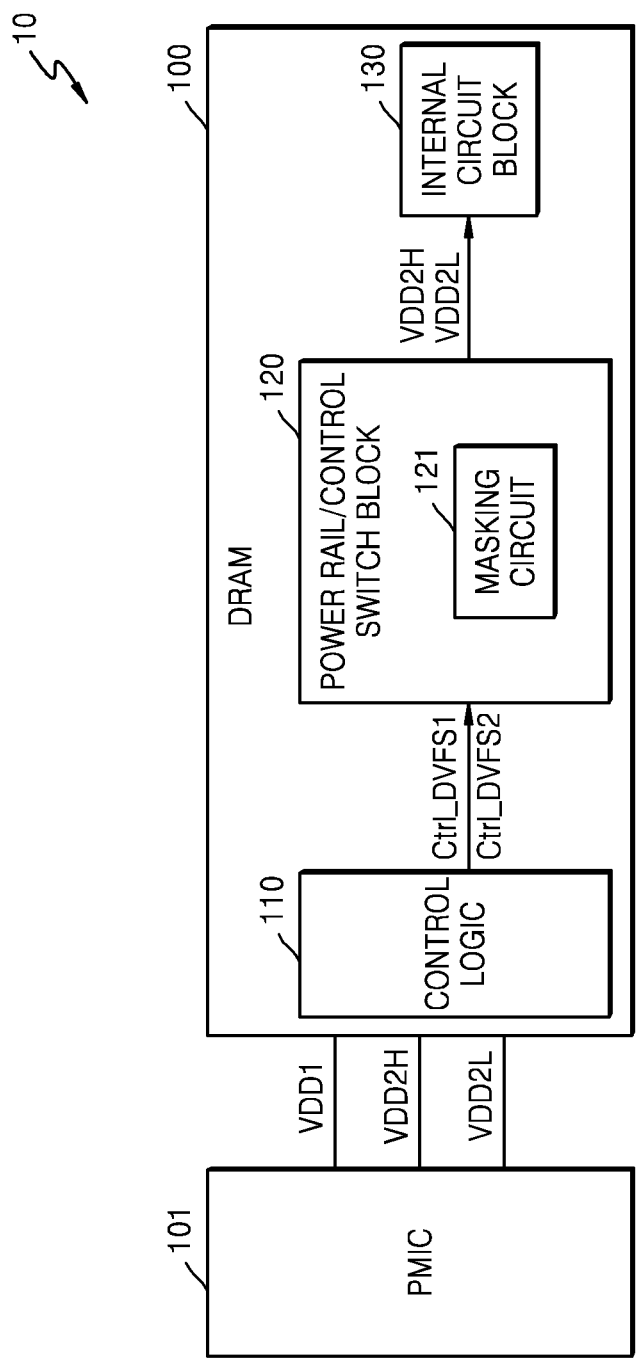
FIG. 1 is a block diagram illustrating a memory system including a memory device according to an embodiment.

FIG. 1 is a block diagram illustrating a memory system 10 including a memory device according to an embodiment. In the following embodiments, dynamic random-access memory (DRAM) corresponding to a volatile memory is illustrated as a memory device included in the memory system 10. However, embodiments of the disclosure are not limited thereto. For example, the memory device may be applied to another kind of volatile memory or the memory device according to the embodiments of the disclosure may be applied to a non-volatile memory such as a resistive memory device or a flash memory device.

The memory system 10 may include DRAM 100 and a power management integrated circuit (PMIC) 101. The DRAM 100 may receive one or more voltages (or power voltages) from the PMIC 101. The DRAM 100 may be driven in accordance with one of various specifications. For example, the DRAM 100 may be driven in accordance with a low power double data rate (LPDDR) specification.

The DRAM 100 may receive various levels of power voltages from the PMIC 101. In FIG. 1, a first power voltage VDD1, a second high-power voltage VDD2H, and a second low-power voltage VDD2L that are defined in the LPDDR specification are illustrated as an example. For example, the first power voltage VDD1 has the highest level, the second high-power voltage VDD2H has the second highest level, and the second low-power voltage VDD2L may have the lowest level. The above terms may be arbitrarily defined. For example, the voltage VDD1 having the highest level is referred to as a second power voltage, the voltage VDD2H having the second highest level is referred to as a first high-power voltage, and the voltage VDD2L having the lowest level may be referred to as a first low-power voltage.

The DRAM 100 may correspond to one of various kinds of semiconductor memory devices. According to an embodiment, the DRAM 100 may correspond to one of double data rate synchronous dynamic random-access memory (DDR SDRAM), a low power double data rate (LPDDR) SDRAM, graphics double data rate (GDDR) SDRAM, Rambus dynamic random-access memory (RDRAM), and the like. In addition, the DRAM 100 may perform communication in accordance with various kinds of specifications. For example, the DRAM 100 may perform communication in accordance with an LPDDR specification including LPDDR5.

According to an embodiment of the disclosure, the DRAM 100 may include a control logic 110, a power rail/control switch block 120, and an internal circuit block 130. The internal circuit block 130 may include various kinds of circuits in relation to a memory operation. For example, although not shown in FIG. 1, the DRAM 100 may include a memory cell array including a plurality of DRAM cells and a peri circuit including various kinds of circuit blocks for driving the memory cell array. For example, the internal circuit block 130 may include at least some of a plurality of circuit blocks that configure a memory cell array and a peri circuit.

According to an embodiment, various circuit blocks used for a memory operation are provided in the DRAM 100 and some circuit blocks may selectively receive at least two power voltages in accordance with a characteristic of a power voltage used by each circuit block. For example, a DVFS technique may be applied to the DRAM 100 and a power voltage having a high level is provided to a specific circuit block or a power voltage having a low level may be provided to a specific circuit block in accordance with an operation mode of the DRAM 100 based on the DVFS technique. Hereinafter, it is assumed that, as the DVFS technique is applied, the internal circuit block 130 includes circuit blocks that selectively receive a second high-power voltage VDD2H and a second low-power voltage VDD2L. However, it is not necessary that an embodiment of the disclosure be limited thereto. As the DVFS technique is applied, different kinds of two or more power voltages among power voltages used in the DRAM 100 may be provided to the internal circuit block 130.

According to an embodiment, the DRAM 100 controls a frequency of a clock signal provided to the internal circuit block 130 or may change a level of a power voltage provided to the internal circuit block 130 in order to control operation performance For example, when the DRAM 100 enters a low power mode (or a low performance operation mode or a low speed operation mode), the second low-power voltage VDD2L may be provided to the internal circuit block 130. On the other hand, when the DRAM 100 enters a normal power mode (or a high-performance operation mode or a high-speed operation mode), the second high-power voltage VDD2H may be provided to the internal circuit block 130.

According to an embodiment, the power rail/control switch block 120 includes a plurality of power rails for transmitting power voltages and switches (for example, control switches) for transmitting power voltages among the plurality of power rails. For example, the plurality of power rails is for transmitting the first power voltage VDD1, the second high-power voltage VDD2H, and the second low-power voltage VDD2L and the control switch block may include switches arranged among the plurality of power rails in order to provide power voltages to the internal circuit block 130.

The switches may include a first DVFS switch for transmitting the second high-power voltage VDD2H to a specific power rail (for example, a first power rail) and a second DVFS switch for transmitting the second low-power voltage VDD2L to the first power rail. The internal circuit block 130 may receive a power voltage through the first power rail. For example, as the first DVFS switch is turned on in the normal power mode, the internal circuit block 130 may receive the second high-power voltage VDD2H from the first power rail and, as the second DVFS switch is turned on in the low-power mode, the internal circuit block 130 may receive the second low-power voltage VDD2L from the first power rail.

As an implementation example, the first DVFS switch and the second DVFS switch may be connected to a common node (for example, a short node) of the first power rail. At this time, during initial driving of the DRAM 100, a period (for example, a power up period) exists in which power of a power voltage provided to the DRAM 100 (or used in the DRAM 100) increases. In the power up period, a level of a control signal for controlling the first DVFS switch and the second DVFS switch may be in an unstable state. At this time, in a state in which all the DVFS switches are turned off, when the DVFS switches are turned on after a level of power increases, a large current (for example, a peak current) rapidly flows through a capacitance component (for example, a parasitic capacitance component) that exists in the common node of the first power rail so that power consumption may increase or element damage may occur. In addition, in a state in which the level of power is lower than threshold voltages of the DVFS switches, on/off states of the DVFS switches correspond to an unknown state and, in accordance with erroneous operations of the DVFS switches, a power-short may occur.

According to an embodiment, in an initial driving period of the DRAM 100, the control logic 110 may provide control signals Ctrl_DVFS1 and Ctrl_DVFS2 for controlling the first DVFS switch and the second DVFS switch to the power rail/control switch block 120. In addition, a masking circuit 121 is arranged in response to at least one of the first DVFS switch and the second DVFS switch and the masking circuit 121 may perform a signal processing operation for controlling at least one switching state (a turn on or off state) of the first DVFS switch and the second DVFS switch in the initial driving period of the DRAM 100. According to an embodiment, switching states of the first and second DVFS switches may be controlled by the masking circuit 121 regardless of states of the control signals Ctrl_DVFS1 and Ctrl_DVFS2. That is, the masking circuit 121 may be defined as masking the control signals Ctrl_DVFS1 and Ctrl_DVFS2 and may be defined as outputting a masked control signal.

For example, when the masking circuit 121 is arranged in response to the first DVFS switch, the masking circuit 121 receives the first control signal Ctrl_DVFS1 from the control logic 110, performs one or more operations for masking processing to generate a first masking control signal, and may use the generated first masking control signal for controlling the first DVFS switch.

As an operation example, in order to prevent a large peak current from rapidly flowing through the common node of the first power rail, the masking circuit 121 may perform a control operation for maintaining at least one of the first DVFS switch and the second DVFS switch to be in a turn on state in the initial driving period of the DRAM 100. For example, in the initial driving period of the DRAM 100, the first masking control signal may maintain a logic state in which the first DVFS switch is turned on. That is, it is possible to prevent both of the first and second DVFS switches from being turned off in the initial driving period, therefore it is possible to prevent a peak current from being generated and to prevent an element from being damaged by the peak current.

On the other hand, although not shown in FIG. 1, the DRAM 100 may further include other circuit blocks that receive a power voltage in accordance with other characteristics. For example, circuit blocks using only the first power voltage VDD1 among the above-described power voltages, circuit blocks using only the second high-power voltage VDD2H, and circuit blocks using only the second low-power voltage VDD2L may be further provided in the DRAM 100.

FIG. 2 is a view illustrating an example of power rails arranged in DRAM.

Referring to FIGS. 1 and 2, the above-described various power voltages may be transmitted by the power rails in the DRAM 100. For example, in FIG. 2, as the power rails for transmitting power voltages provided from the outside, a VDD1 power rail for transmitting the first power voltage VDD1, a VDD2H power rail for transmitting the second high-power voltage VDD2H, and a VDD2L power rail for transmitting the second low-power voltage VDD2L are illustrated. In addition, in FIG. 2, as the power rails for transmitting a power voltage to various circuit blocks in the DRAM 100, a VINT power rail for transmitting a first internal voltage VINT, a VPWR_INT power rail for transmitting a second internal voltage VPWR_INT, and a VPWR_2H power rail for transmitting a third internal voltage VPWR_2H. The VINT power rail, the VPWR_INT power rail, and the VPWR_2H power rail may be referred to as internal power rails in view of being arranged in order to transmit a power voltage to various circuit blocks in the DRAM 100.

The VINT power rail transmits the first internal voltage VINT to which a DVFS technique is applied. In accordance with DVFS switching, the first internal voltage VINT may correspond to the second high-power voltage VDD2H or the second low-power voltage VDD2L. In addition, the second internal voltage VPWR_INT corresponds to a power voltage to which the DVFS and power gating (PG) techniques are applied and the second internal voltage VPWR_INT may correspond to the first internal voltage VINT transmitted to the VPWR_INT power rail by a PG switch.

Various circuit blocks in the DRAM 100 are connected to the VINT power rail to receive the second high-power voltage VDD2H or the second low-power voltage VDD2L or may be connected to the VPWR_INT power rail to receive the second high-power voltage VDD2H or the second low-power voltage VDD2L to which PG is applied. In addition, the VPWR_2H power rail may be arranged for some circuit blocks in the DRAM 100 that exclusively use the second high-power voltage VDD2H. For example, the VPWR_2H power rail may be connected to the VDD2H power rail through a PG switch.

Circuit blocks in the DRAM 100 receive power voltages through the plurality of power rails and switches connected to the power rails. Some circuit blocks regularly receive only the first power voltage VDD1 and other some circuit blocks may regularly receive the second low power voltage VDD2L.

FIGS. 3A and 3B are circuit diagrams illustrating an example of a switching operation in accordance with a dynamic voltage and frequency scaling (DVFS) technique.

Referring to FIG. 3A, the memory device may include a first DVFS switch SW_DVFS1 connected to the VDD2H power rail and a second DVFS switch SW_DVFS2 connected to the VDD2L power rail. The first DVFS switch SW_DVFS1 and the second DVFS switch SW_DVFS2 may be connected to a node of the VINT power rail. In addition, a circuit block is connected to the VINT power rail and may receive various kinds of power voltages. For example, in accordance with an operation mode of the memory device, the second high-power voltage VDD2H or the second low-power voltage VDD2L may be selectively provided to a circuit block. That is, in a normal operation of the memory device, the first DVFS switch SW_DVFS1 and the second DVFS switch SW_DVFS2 may be alternately switched.

On the other hand, referring to FIG. 3B, the memory device may include the first DVFS switch SW_DVFS1 connected to the VDD2H power rail and the second DVFS switch SW_DVFS2 connected to the VDD2L power rail. In addition, the memory device may further include a PG switch SW_PG connected between the VINT power rail and the VPWR_INT power rail. As described above, the first DVFS switch SW_DVFS1 provides the second high-power voltage VDD2H to the VINT power rail based on a switching operation and the second DVFS switch SW_DVFS2 may provide the second low-power voltage VDD2L to the VINT power rail based on the switching operation. In addition, the PG switch SW_PG may transmit the power voltage applied to the VINT power rail to the VPWR_INT power rail or may block transmission of the power voltage.

According to an embodiment, some of the plurality of circuit blocks included in the memory device are connected to the VINT power rail to which DVFS is applied and some other circuit blocks may be connected to the VPWR_INT power rail to which DVFS and PG are applied. For example, the circuit block (Circuit B1K1) connected to the VINT power rail may regularly receive the second high-power voltage VDD2H or the second low-power voltage VDD2L in accordance with the operation mode of the memory device. On the other hand, the circuit block (Circuit BLK2) connected to the VPWR_INT power rail receives the second high-power voltage VDD2H or the second low-power voltage VDD2L. In another specific mode of the memory device, as the PG switch SW_PG is turned off, supply of the power voltage may be blocked.

Figure 4A:
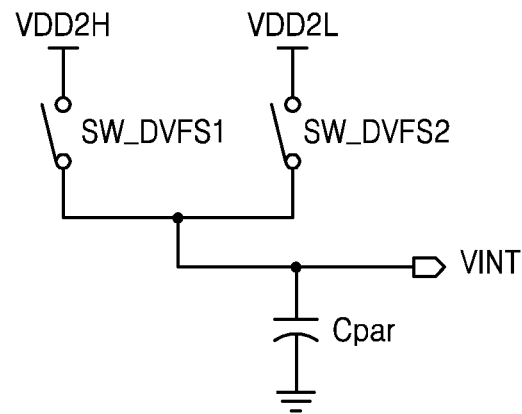
FIG. 4A is a related art example of a memory device generating a peak current by DVFS switches.
Figure 4B:
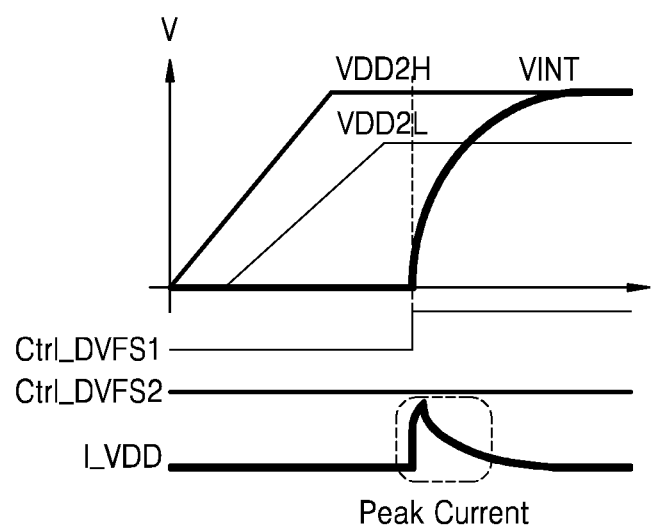
FIG. 4B graphically illustrates voltages and a current of the related art memory device illustrated by FIG. 4A before, during, and after it generates the peak current.

FIG. 4A is a related art example of a memory device generating a peak current by DVFS switches. FIG. 4B graphically illustrates voltages and a current of the related art memory device illustrated by FIG. 4A before, during, and after it generates the peak current. In FIGS. 4A and 4B, it is assumed that the DVFS switches are turned on by a logic high control signal and, during initial driving of the memory device, control signals for controlling the DVFS switches are set to be in a logic low state.

Referring to FIGS. 4A and 4B, during the initial driving of the memory device, the power up period exists and levels of the second high-power voltage VDD2H and the second low-power voltage VDD2L may rise. At this time, in the initial driving period of the memory device, the first and second DVFS switches SW_DVFS1 and SW_DVFS2 maintain a turn off state and, after the initializing period is terminated (or after the level of power completely rises), the first DVFS switch SW_DVFS1 is set to be turned on so that a current I_VDD may flow through a capacitance component Cpar connected to the above-described common node by the second high-power voltage VDD2H. That is, charges are rapidly injected into the capacitance component Cpar by the second high-power voltage VDD2H and the element of the memory device may be damaged by a peak current generated in the injection process.

Figure 5:
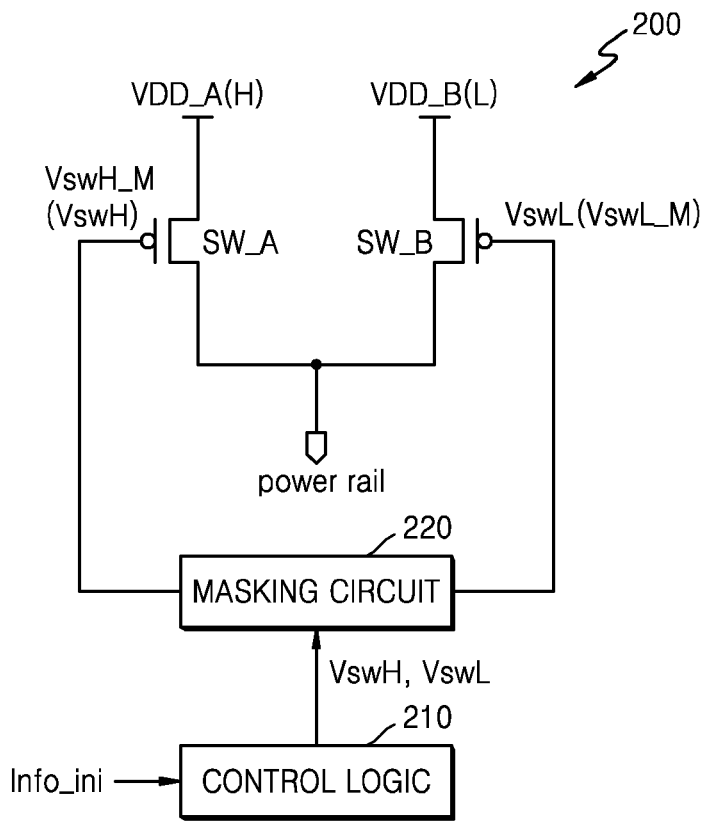
FIG. 5 is a block diagram illustrating a configuration of a memory device according to an embodiment.

FIG. 5 is a block diagram illustrating a configuration of a memory device 200 according to an embodiment. Without being limited to the second high-power voltage VDD2H and the second low-power voltage VDD2L like in the above-described embodiment, the power voltages VDD_A and VDD_B illustrated in FIG. 5 may be configured by other various kinds of power voltages that may be applied to a DVFS function.

The memory device 200 includes switches for switching various kinds of power voltages. In FIG. 5, the memory device 200 is illustrated as including a first switch SW_A connected to the first power voltage VDD_A and a second switch SW_B connected to the second power voltage VDD_B. In addition, one node of each of the first switch SW_A and the second switch SW_B may be connected to a power rail for transmitting at least two power voltages. According to the above-described embodiment, when the first power voltage VDD_A and the second power voltage VDD_B are the second high-power voltage VDD2H and the second low power voltage VDD2L related to the DVFS technique, the power rail may be the VINT power rail or the VPWR_INT power rail.

During the initial driving of the memory device, the control logic 210 may generate a first control signal VswH for controlling the first switch SW_A and a second control signal VswL for controlling the second switch SW_B. For example, the control logic 210 may generate the first control signal VswH and the second control signal VswL based on initializing information Info_ini that represents the initializing operation of the memory device. The initializing information Info_ini is generated in the memory device 200 or may be generated from a signal provided from a controller (not shown) for controlling the memory device 200.

According to an embodiment of the disclosure, a masking circuit 220 receives the first control signal VswH and the second control signal VswL and may perform masking processing on the first control signal VswH and the second control signal VswL. For example, when the masking circuit 220 controls a switching state of the first switch SW_A, the masking circuit 220 generates a first masking control signal VswH_M obtained by masking the first control signal VswH and may provide the first masking control signal VswH_M to the first switch SW_A. On the other hand, when the masking circuit 220 performs masking processing on the second control signal VswL, the masking circuit 220 generates a second masking control signal VswL_M obtained by masking the second control signal VswL and may provide the second masking control signal VswL_M to the second switch SW_B.

In the configuration illustrated in FIG. 5, in the initial driving period of the memory device 200, the first switch SW_A may maintain a turn on state by the first masking control signal VswH_M. That is, in the initial driving period of the memory device 200, regardless of a turn on or off state of the second switch SW_B, the first switch SW_A maintains a turn on state so that charges may flow to a capacitance component connected to a node of a power rail. In addition, after the initial driving period, when the first switch SW_A maintains a turn on state and the second switch SW_B is in a turn off state through a switching control operation, previously flowed charges exist in the capacitance component so that it is possible to prevent a peak current from being generated due to rapid flow of charges to the capacitance component.

Figure 6:
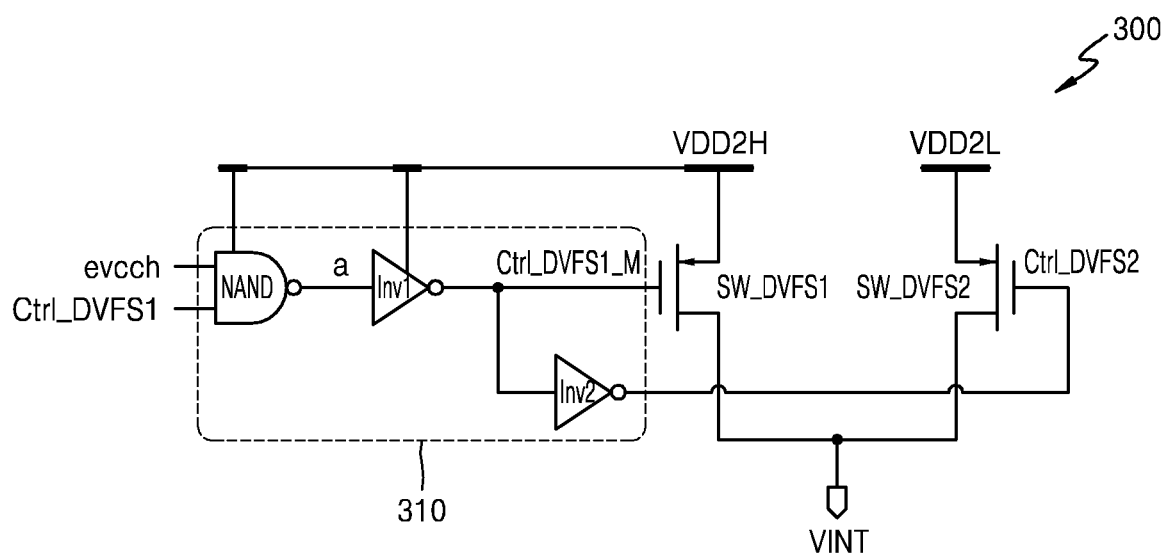
FIGS. 6 and 7 are a circuit diagram and an operation waveform diagram illustrating an implementation example of a memory device according to an embodiment.
Figure 7:
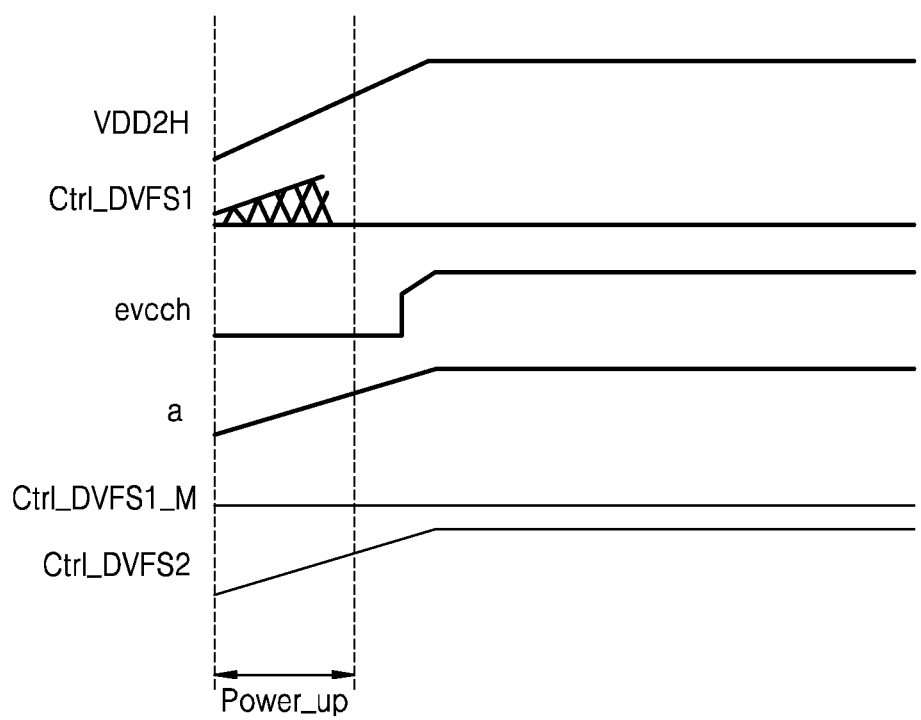

FIGS. 6 and 7 are a circuit diagram and an operation waveform diagram illustrating an implementation example of a memory device 300 according to an embodiment. In FIGS. 6 and 7, DVFS switches in accordance with the DVFS technique are illustrated. As the DVFS switches are implemented by p-type metal-oxide-semiconductor (PMOS) transistors, each of the DVFS switches is turned on by a logic low control signal. In addition, an example in which the second high-power voltage VDD2H and the second low power voltage VDD2L are switched by the DVFS switches is illustrated. The DVFS switches being connected to a power voltage may be understood as the DVFS switches being connected to a power rail for connecting the power voltage.

Referring to FIG. 6, the memory device 300 may include the first DVFS switch SW_DVFS1 connected to the second high-power voltage VDD2H and the second DVFS switch SW_DVFS2 connected to the second low-power voltage VDD2L. The first DVFS switch SW_DVFS1 and the second DVFS switch SW_DVFS2 may be connected to the VINT power rail. In addition, the memory device 300 may further include a masking circuit 310 according to the above-described embodiment. In FIG. 6, an example in which the masking circuit 310 performs an operation for performing masking processing on the first control signal Ctrl_DVFS1 is illustrated. As an implementation example, the masking circuit 310 may include a NAND gate NAND and one or more inverters Inv1 and Inv2. An output of the NAND gate NAND is provided to the first inverter Inv1 through a node "a" and an output of the first inverter Inv1 is provided to the second inverter Inv2. The output of the first inverter Inv1 may correspond to a first mask control signal Ctrl_DVFS1_M for controlling the first DVFS switch SW_DVFS1. In addition, an output of the second inverter Inv2 obtained by inverting the first mask control signal Ctrl_DVFS1_M may correspond to a second control signal Ctrl_DVFS2 for controlling the second DVFS switch SW_DVFS2.

In FIG. 6, the masking circuit 310 is illustrated as providing the second control signal Ctrl_DVFS2. However, it is not necessary for the embodiment of the disclosure to be limited thereto. For example, the masking circuit 310 masks the first control signal Ctrl_DVFS1 and the second control signal Ctrl_DVFS2 may be additionally generated by a control logic (not shown) in the memory device 300. In addition, the masking circuit 310 may include the NAND gate NAND and the first inverter Inv1.

According to an operation example, the NAND gate NAND receives the first control signal Ctrl_DVFS1 and an internal control signal "evcch" generated by the control logic (not shown) in the memory device 300 and may output a NAND operation result of the first control signal Ctrl_DVFS1 and the internal control signal. In addition, the first inverter Inv1 may provide a signal obtained by inverting the operation result from the NAND gate NAND to a gate electrode of the first DVFS switch SW_DVFS1. In addition, the first inverter Inv1 may provide an output obtained by inverting the operation result from the NAND gate NAND to a gate electrode of the first DVFS switch SW_DVFS1. In addition, the second inverter Inv2 may provide an output obtained by inverting the output from the first inverter Inv1 to a gate electrode of the second DVFS switch SW_DVFS2.

An operation example of the memory device 300 illustrated in FIG. 6 will be described as follows with reference to FIG. 7.

The control logic (not shown) in the memory device 300 may generate the internal control signal "evcch" in the initial driving period of the memory device 300 based on initializing information Info_ini shown in FIG. 5 and the internal control signal "evcch" may be in a logic low state in the initial driving period. In addition, the control logic may generate the first control signal Ctrl_DVFS1 and, since power does not have a stable level in the initial driving period of the memory device 300, the first control signal Ctrl_DVFS1 may have an unstable waveform.

The internal control signal "evcch" can be generated according to various methods, and the internal control signal "evcch" can maintain a predetermined logic state in the initial driving period as described above. For example, when the initializing information Info_ini maintains a predetermined logic state in the initial driving period, the internal control signal "evcch" may correspond to the initializing information Info_ini. In addition, the internal control signal "evcch" may be generated based on other kinds of information related to the initial driving period. For example, the internal control signal "evcch" may be generated based on various information generated in the memory controller and/or the memory device.

As the NAND gate NAND receives the internal control signal "evcch" of a logic low state, an output of the NAND gate NAND may have a logic high state regardless of the first control signal Ctrl_DVFS1. As illustrated in FIG. 7, the node "a" to which the output of the NAND gate NAND is applied is in a logic high state. However, because power is rising in the initial driving period of the memory device 300, a voltage of the node "a" has a waveform in which a level thereof normally rises. That is, a voltage having the waveform illustrated in FIG. 7 may be applied to the node "a" connected to the output of the NAND gate NAND.

On the other hand, the first inverter Inv1 inverts the output of the NAND gate NAND corresponding to logic high so that the first mask control signal Ctrl_DVFS1_M provided to the first DVFS switch SW_DVFS1 may be in a logic low state. In addition, as the internal control signal "evcch" maintains a logic low state in the initial driving period of the memory device 300, the first mask control signal Ctrl_DVFS1_M may maintain a logic low state and the first DVFS switch SW_DVFS1 may maintain a turn on state in response to the first mask control signal Ctrl_DVFS1_M. On the other hand, a signal obtained by inverting the first mask control signal Ctrl_DVFS1_M may be provided to the second DVFS switch SW_DVFS2 as the second control signal Ctrl_DVFS2 and the second DVFS switch SW_DVFS2 may be turned on or off in accordance with a voltage level state of the second control signal Ctrl_DVFS2.

Then, after the initial driving period is terminated and power of the memory device 300 is stabilized to a normal state, the internal control signal "evcch" is transitioned to a logic high state in a common mode of the memory device 300 and the first DVFS switch SW_DVFS1 and the second DVFS switch SW_DVFS2 may be alternately switched. For example, as the first control signal Ctrl_DVFS1 maintains a logic low state, the first mask control signal Ctrl_DVFS1_M maintains a logic low state and, in response to the first mask control signal Ctrl_DVFS1_M, the first DVFS switch SW_DVFS1 may maintain a turn on state. On the other hand, as the second control signal Ctrl_DVFS2 maintains a logic high state, in response to the second control signal Ctrl_DVFS2, the second DVFS switch SW_DVFS2 may maintain a turn off state.

According to the above-described embodiment illustrated in FIGS. 6 and 7, in the initial driving period of the memory device 300, a switch (for example, the first DVFS switch SW_DVFS1) maintains a turn on state so that a node of the VINT power rail may be charged to a level corresponding to the second high-power voltage VDD2H. Therefore, after the initial driving period is terminated, although a power voltage of which a level is sufficiently raised is switched by the first DVFS switch SW_DVFS1 or the second DVFS switch SW_DVFS2, the above-described instantaneous increase in current may be reduced and it is possible to prevent elements from being damaged.

On the other hand, in FIG. 6, as an implementation example of the masking circuit 310, one NAND gate NAND and the two inverters Inv1 and Inv2 are illustrated. However, it is not necessary for embodiments of the disclosure to be limited thereto. For example, the masking circuit 310 may be implemented by using various kinds of logic elements and the memory device 300 may be implemented so that at least one of the first DVFS switch SW_DVFS1 and the second DVFS switch SW_DVFS2 maintains a turn on state in the initial driving period of the memory device 300 by using logic elements in the masking circuit 310 together with various internal control signals.

Figure 8:
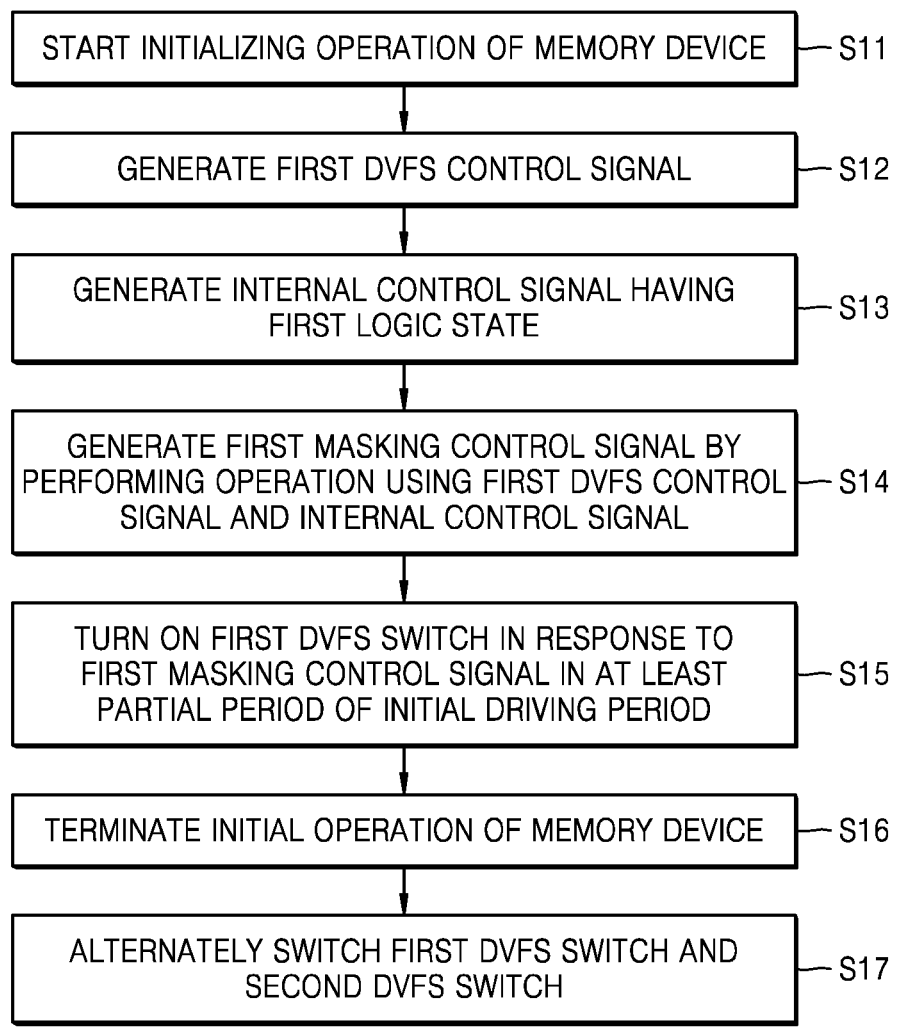
FIG. 8 is a flowchart illustrating a method of operating a memory device according to an embodiment.

FIG. 8 is a flowchart illustrating a method of operating a memory device according to an embodiment. In FIG. 8, the first DVFS switch and the second DVFS switch are illustrated and it is assumed that the first DVFS switch is connected to the first power voltage and the second DVFS switch is connected to the second power voltage.

Referring to FIG. 8, as the initializing operation of the memory device is performed, power of a power voltage rises in the initial driving period in operation S11 and, in the initial driving period, the first DVFS control signal for controlling the first DVFS switch connected to the first power voltage may be generated in operation S12. In order to perform masking processing according to the embodiments of the disclosure, the internal control signal in the first logic state may be generated in operation S13. The internal control signal maintains the first logic state in at least a portion of the initial driving period. In addition, the first logic state may correspond to a logic high state or a logic low state based on a kind of a logic circuit used for masking processing or a kind of the first DVFS switch.

In addition, an operation for masking processing may be performed. For example, the first masking control signal may be generated by performing an operation by using the first DVFS control signal and the internal control signal in operation S14. The logic state of the first masking control signal may be for turning on the first DVFS switch. Therefore, in at least a partial period of the initial driving period, the first DVFS switch may be turned on in response to the first masking control signal in operation S15. At this time, the second DVFS control signal for controlling the second DVFS switch connected to the second power voltage is generated by a control logic in the memory device or may be generated by using the first DVFS control signal and the second DVFS switch may be turned off in the initial driving period.

Then, the initializing operation of the memory device may be terminated in operation S16 and, in a common mode of the memory device, the first masking control signal may have the same logic state as the first DVFS control signal. In addition, in the common mode of the memory device, the first DVFS switch and the second DVFS switch may be alternately switched in operation S17. As described in the previous embodiment, as the first DVFS switch is turned on in the initial driving period of the memory device, the capacitance component that exists in the common node of the power rail commonly connected to the first DVFS switch and the second DVFS switch is charged so that, in a common mode, the peak current caused by switching of the DVRFS switch may be reduced or removed.

Figure 9:
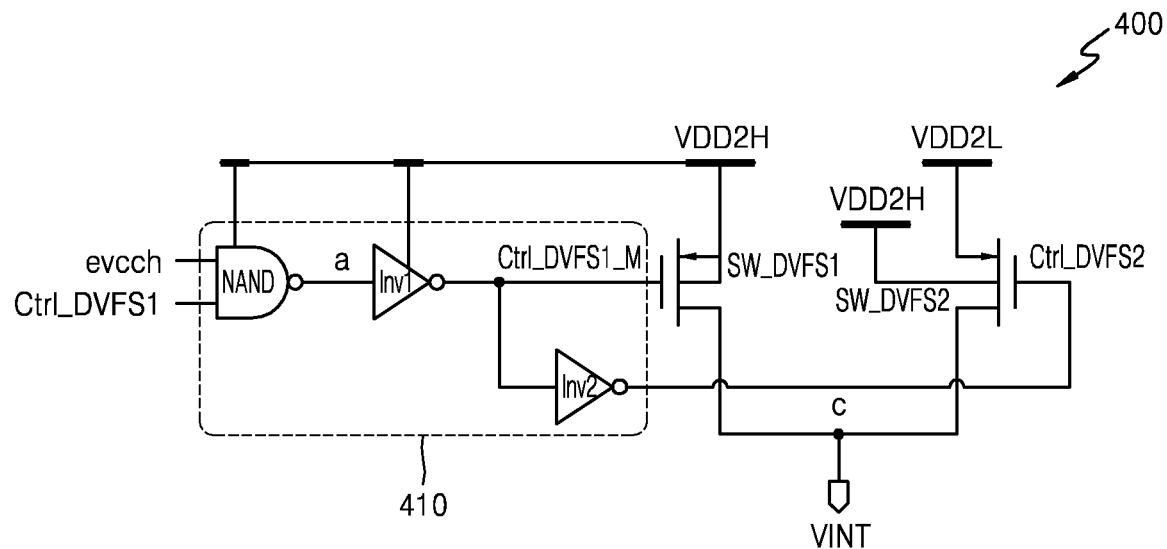
FIG. 9 is a circuit diagram illustrating DRAM according to a modifiable embodiment.

FIG. 9 is a circuit diagram illustrating DRAM according to a modifiable embodiment. In describing the components illustrated in FIG. 9, since operations of the components of FIG. 9 are the same as or similar to those of FIG. 6 with respect to the same component, description thereof will not be given.

Referring to FIG. 9, a memory device 400 includes first and second DVFS switches SW_DVFS1 and SW_DVFS2 and may further include a masking circuit 410 according to the above-described embodiments. As an implementation example of the masking circuit 410, the masking circuit 410 includes a NAND gate NAND and one or more inverters Inv1 and Inv2.

According to an embodiment, the first and second DVFS switches SW_DVFS1 and SW_DVFS2 may be implemented by MOS transistors (for example, PMOS transistors) and a power voltage may be applied to a bulk of each of the MOS transistors. For example, in FIG. 9, the second high-power voltage VDD2H may be applied to a bulk of each of the first and second DVFS switches SW_DVFS1 and SW_DVFS2.

During an initializing operation of the memory device 400, a power up period exists. In addition, according to an embodiment of the disclosure, in an initial driving period of the memory device 400, the first DVFS switch SW_DVFS1 may be turned on. Therefore, as the first DVFS switch SW_DVFS1 is turned on, a voltage of a common node C of the VINT power rail may be increased to the second high-power voltage VDD2H.

At this time, one electrode of the second DVFS switch SW_DVFS2 is connected to the common node C so that a voltage of the electrode connected to the common node C of the second DVFS switch SW_DVFS2 may be higher than the voltage of the bulk. In this case, a reverse current is generated through the bulk of the second DVFS switch SW_DVFS2 so that current leakage and an element damage probability may be generated. On the other hand, according to the current embodiment, the second high-power voltage VDD2H connected to the first DVFS switch SW_DVFS1 is provided to the bulk of the second DVFS switch SW_DVFS2 so that it is possible to reduce a probability of generating the reverse current.

On the other hand, in FIG. 9, the second high-power voltage VDD2H is illustrated as being provided to the bulk of the second DVFS switch SW_DVFS2. However, it is not necessary for the embodiment of the disclosure to be limited thereto. For example, a circuit may be implemented so that the first power voltage VDD1 having a higher level than the second high-power voltage VDD2H described in the above-described embodiment is provided to the bulk of the second DVFS switch SW_DVFS2.

Figure 10A:
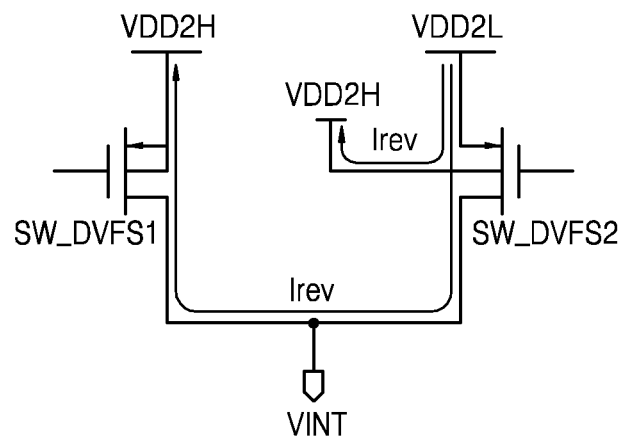
FIGS. 10A and 10B are views illustrating an example of a reverse current phenomenon generated in a DVFS switch.
Figure 10B:
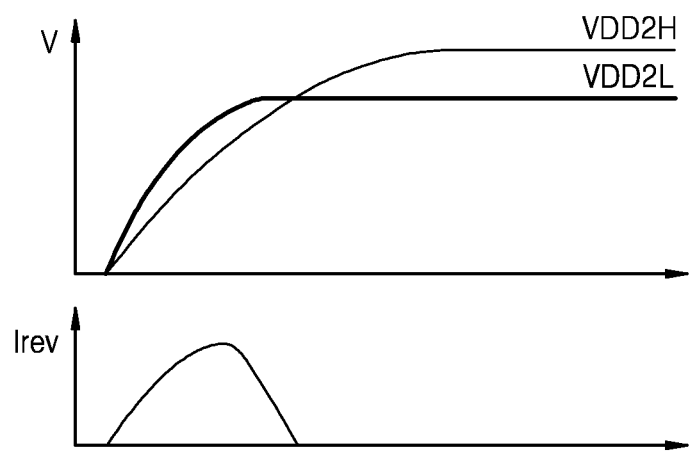

On the other hand, FIGS. 10A and 10B are views illustrating an example of a reverse current phenomenon generated in a DVFS switch. Description of the same components as those of the above-described embodiments among the components illustrated in the following embodiments will not be given.

Referring to FIGS. 10A and 10B, the first DVFS switch SW_DVFS1 and the second DVFS switch SW_DVFS2 may be implemented by the PMOS transistors and the second high-power voltage VDD2H may be applied to the bulk of each of the DVFS switches. During the initializing operation of the memory device, in the power up period, a level of the second low-power voltage VDD2L may be higher than a level of the second high-power voltage VDD2H. In this case, the reverse current Irev may be generated as illustrated in FIG. 10A.

FIGS. 11 to 13A and 13B are views illustrating an example of reducing generation of a reverse current Irev according to embodiments of the disclosure. Hereinafter, the memory device corresponds to the DRAM.

Figure 11:
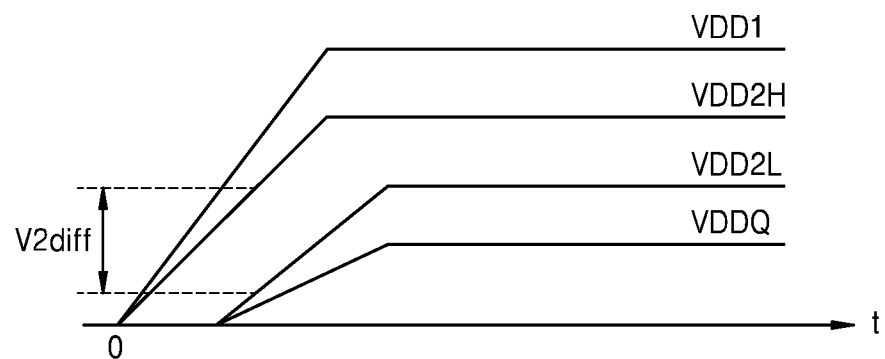
FIG. 11 illustrates power provision timing of DRAM, according to an embodiment of the disclosure.

Referring to FIG. 11, an example of power provision timing of the DRAM and PMIC is illustrated and reception timings of various power voltages provided from the PMIC to the DRAM may be controlled. For example, the DRAM may receive the first power voltage VDD1, the second high-power voltage VDD2H, and the second low-power voltage VDD2L from the PMIC. In addition, for example, the DRAM further receives a VDDQ voltage from the PMIC. The VDDQ voltage may be used in the DRAM for various purposes. For example, the VDDQ voltage may be used for input and/or output of data.

Transmission or reception timing of a power voltage may be previously set between the DRAM and the PMIC. For example, the second high-power voltage VDD2H and the second low-power voltage VDD2L may be set to be provided from the PMIC to the DRAM so as to have a previously set level difference V2 diff. In addition, for example, so that the second high-power voltage VDD2H and the second low power voltage VDD2L are provided to the DRAM with the above level difference V2diff, the DRAM may receive the second low power voltage VDD2L after a predetermined time after receiving the second high-power voltage VDD2H. The transmission or reception timing of the power voltage may be variously controlled. For example, a system including the DRAM and the PMIC may further include a control device (for example, a memory controller or an application processor) for controlling the DRAM and PMIC and the control device may control the PMIC so that the power voltage is transmitted or received as illustrated in FIG. 11.

Figure 12A:
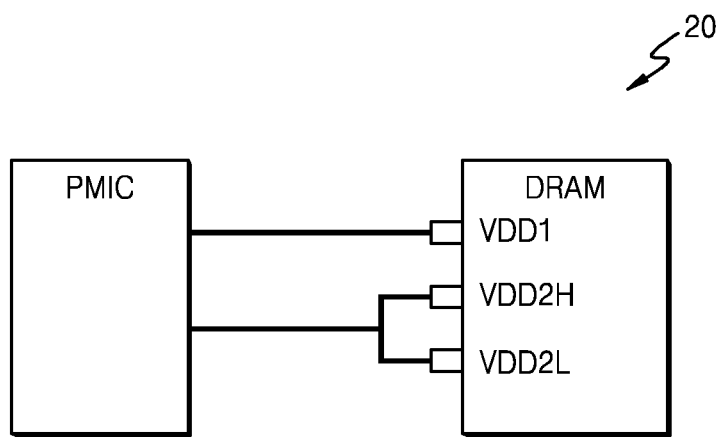
FIGS. 12A and 12B illustrate a system for preventing reverse current, according to an embodiment of the disclosure.
Figure 12B:
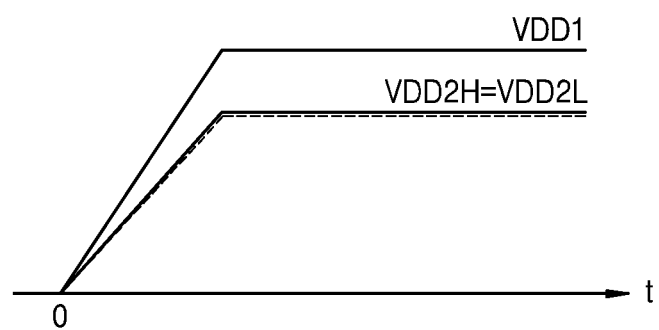

FIGS. 12A and 12B illustrate an implementation example of a system 20 for preventing the above-described reverse current. In FIG. 12A, the DRAM is illustrated as using only the second high-power voltage VDD2H. Therefore, the DRAM includes ports for receiving the second high-power voltage VDD2H and the second low-power voltage VDD2L, and the second high-power voltage VDD2H from the PMIC may be provided through the two ports. That is, in the embodiment illustrated in FIG. 12A, in the initial driving period of the DRAM, a setup process may be performed only on the second high-power voltage VDD2H.

Referring to FIG. 12B, levels of power voltages received by the DRAM of FIG. 12A are illustrated. As illustrated in FIG. 12B, the levels of the power voltages provided to the ports for receiving the second high-power voltage VDD2H and the second low-power voltage VDD2L may be the same. That is, in the initial driving period of the DRAM, one of the second high-power voltage VDD2H and the second low-power voltage VDD2L may be applied to the circuits illustrated in FIG. 10A. Therefore, it is possible to prevent the reverse current Irev from being generated due to a phenomenon in which the level of the second low power voltage VDD2L is higher than the level of the second high-power voltage VDD2H.

Figure 13A:
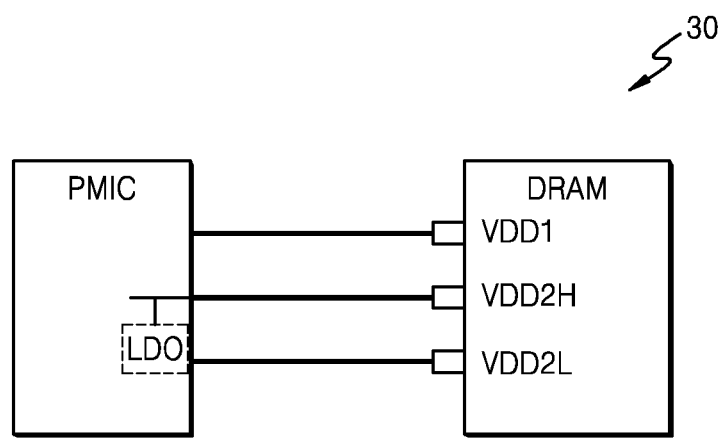
FIGS. 13A and 13B illustrate another system for preventing reverse current, according to an embodiment of the disclosure.
Figure 13B:
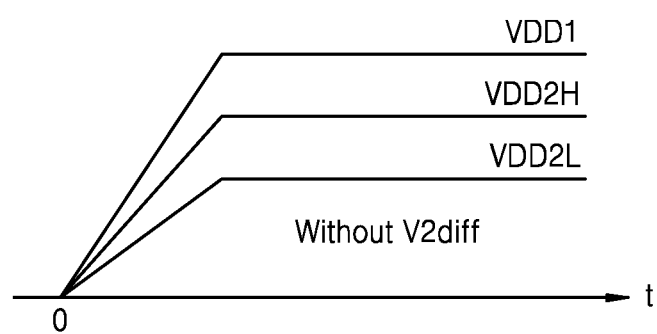

On the other hand, referring to the system 30 and the waveform diagram illustrated in FIGS. 13A and 13B, the PMIC provides the second high-power voltage VDD2H and the second low power voltage VDD2L to the DRAM. The PMIC further includes a low drop output linear regulator (LDO) and the LDO regulator may generate the second low power voltage VDD2L by using the second high-power voltage VDD2H. Therefore, the various power voltages illustrated in FIG. 13A may have the waveforms illustrated in FIG. 13B. At this time, in the setup process of the second high-power voltage VDD2H and the second low power voltage VDD2L, the second high-power voltage VDD2H and the second low-power voltage VDD2L may have a level difference so that it is possible to prevent the above-described reverse current Irev from being generated. According to the current embodiment, a level difference V2diff between the second high-power voltage VDD2H and the second low power voltage VDD2L may be maintained based on an operation of the LDO regulator without lately setting up the second low-power voltage VDD2L or lately providing the second low-power voltage VDD2L to the DRAM in order to let the second high-power voltage VDD2H and the second low power voltage VDD2L have the level difference V2diff like in the above-described embodiment.

Figure 14:
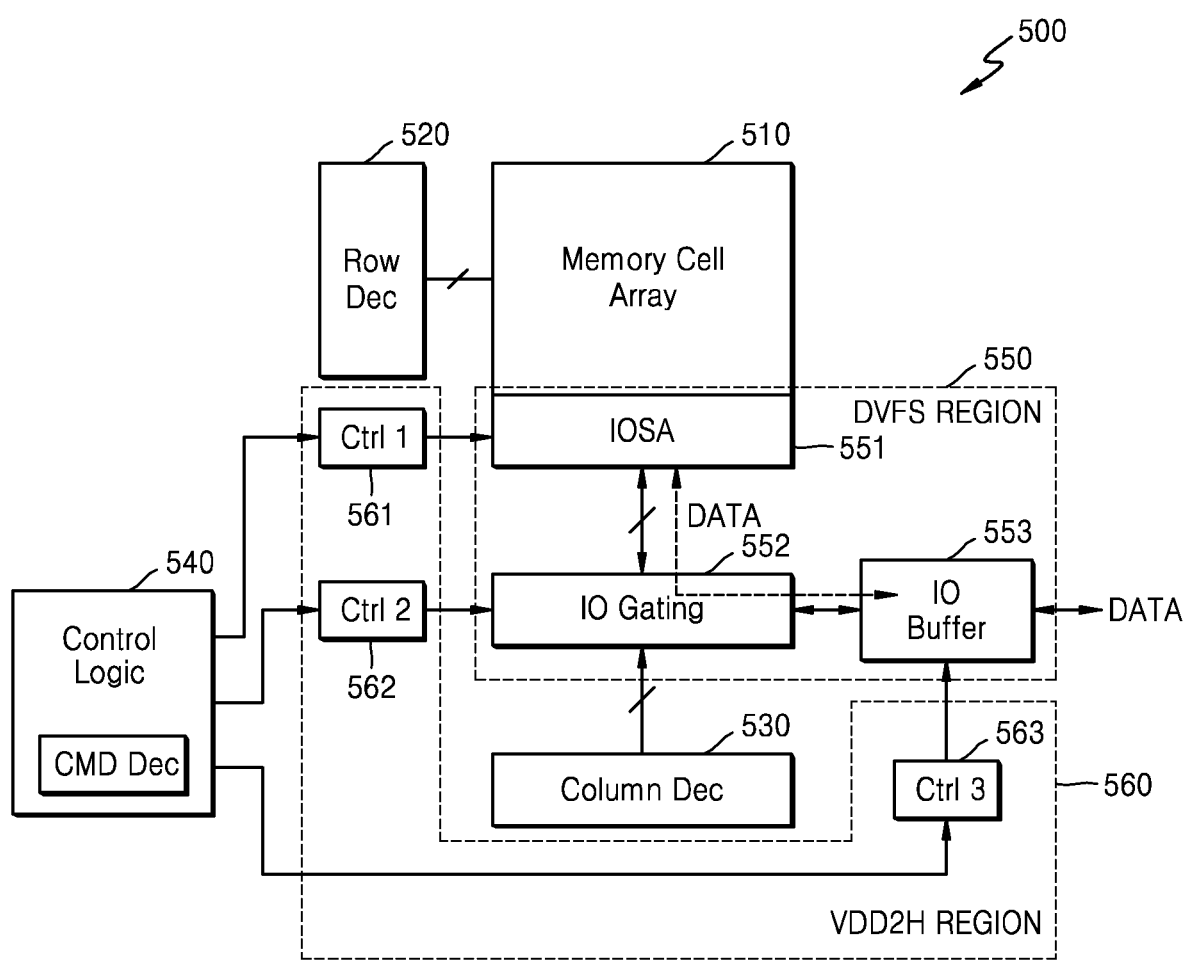
FIG. 14 is a block diagram illustrating an implementation example of a memory device according to another embodiment.

FIG. 14 is a block diagram illustrating an implementation example of a memory device 500 according to another embodiment. In FIG. 14, through the initial operation in accordance with the above-described embodiments, the power voltages (for example, VDD2H and VDD2L) are setup and the power voltages (for example, VDD2H and VDD2L) are provided to various circuit blocks in the memory device 500.

Referring to FIG. 14, the memory device 500 may include a memory cell array 510, a row decoder 520, a column decoder 530, and a control logic 540. In addition, the memory device 500 may further include a first voltage region 550 and a second voltage region 560. The first voltage region 550 corresponds to a data path region (or a DVFS region) and may include one or more data processing blocks. In addition, the second voltage region 560 may include one or more control blocks for controlling the data path region. For example, the first power region 550 may include an input and output sense amplifier 551 for amplifying data, an input and output gating circuit 552 for gating data (DATA) in accordance with a column decoding result, and an input and output buffer 553 for transmitting data (DATA) to and receiving data from the outside. In addition, the second voltage region 560 may include control blocks (e.g., Ctrl 1, Ctrl 2, Ctrl 3) for controlling data processing blocks of the first voltage region 550. For example, first to third control blocks 561 to 563 are illustrated.

The memory cell array 510 may include memory cells connected to a plurality of word lines and a plurality of bit lines. The row decoder 520 may select the word lines in response to a row address from the outside. In addition, the column decoder 530 may select the bit lines in response to a column address from the outside. During a data recording operation, based on selecting operations of the row decoder 520 and the column decoder 530, record data DATA may be provided to a selecting memory cell of the memory cell array 510. In addition, during a data reading operation, based on the selecting operations of the row decoder 520 and the column decoder 530, read data DATA read from the memory cell array 510 may be provided to the outside of the memory device 500.

The control logic 540 may control an entire operation in the memory device 500. For example, the control logic 540 may include a command decoder (CMD Dec) and various circuit blocks in the memory device 500 may be controlled in response to a command from a memory controller. For example, the control logic 540 may control the first to third control blocks 561 through 563 of the second voltage region 560 and the first to third control blocks 561 through 563 may control data processing blocks in the first voltage region 550 based on control of the control logic 540. For example, during a data recording operation, based on control of the first to third control blocks 561 through 563, the record data DATA may be provided to the memory cell array 510 through the input and output buffer 553, the input and output gating circuit 552, and the input and output sense amplifier 551. In addition, during a data reading operation, based on control of the first to third control blocks 561 to 563, the read data DATA may be provided to the outside through the input and output sense amplifier 551, the input and output gating circuit 552, and the input and output buffer 553.

For example, as the first voltage region 550 corresponds to the DVFS region in the above-described embodiment, the first voltage region 550 may be connected to the VINT power rail or the VPWR_INT power rail and the second high-power voltage VDD2H or the second low power voltage VDD2L may be provided to the first voltage region 550. On the other hand, the second voltage region 560 regularly receives the second high-power voltage VDD2H. In the above-described embodiment, the power voltage transmitted through the VPWR_2H may be provided to the circuit blocks in the second voltage region 560 (e.g., VDD2H REGION).

According to an implementation example, the first voltage region 550 and the second voltage region 560 may be functionally and physically separated from each other. That is, in accordance with a function of a circuit block, as described above, voltage regions may be defined and well may be physically separated from the first voltage region 550 and the second voltage region 560. As described above, as regions are separated, circuit blocks included in the same voltage region are adjacent to each other (or are formed in the same well). Therefore, power rails may be properly arranged to correspond to the respective voltage regions.

On the other hand, the control logic 540 may generate control signals for controlling the DVFS switches (not shown) provided in the memory device 500 or may generate one or more internal control signals used for masking processing. In addition, a masking circuit is arranged to correspond to at least one of the DVFS switches (not shown) and, through masking processing performed in the initial driving period of the memory device 500 according to the above-described embodiments, a probability of generating the peak current may be reduced.

Figure 15:
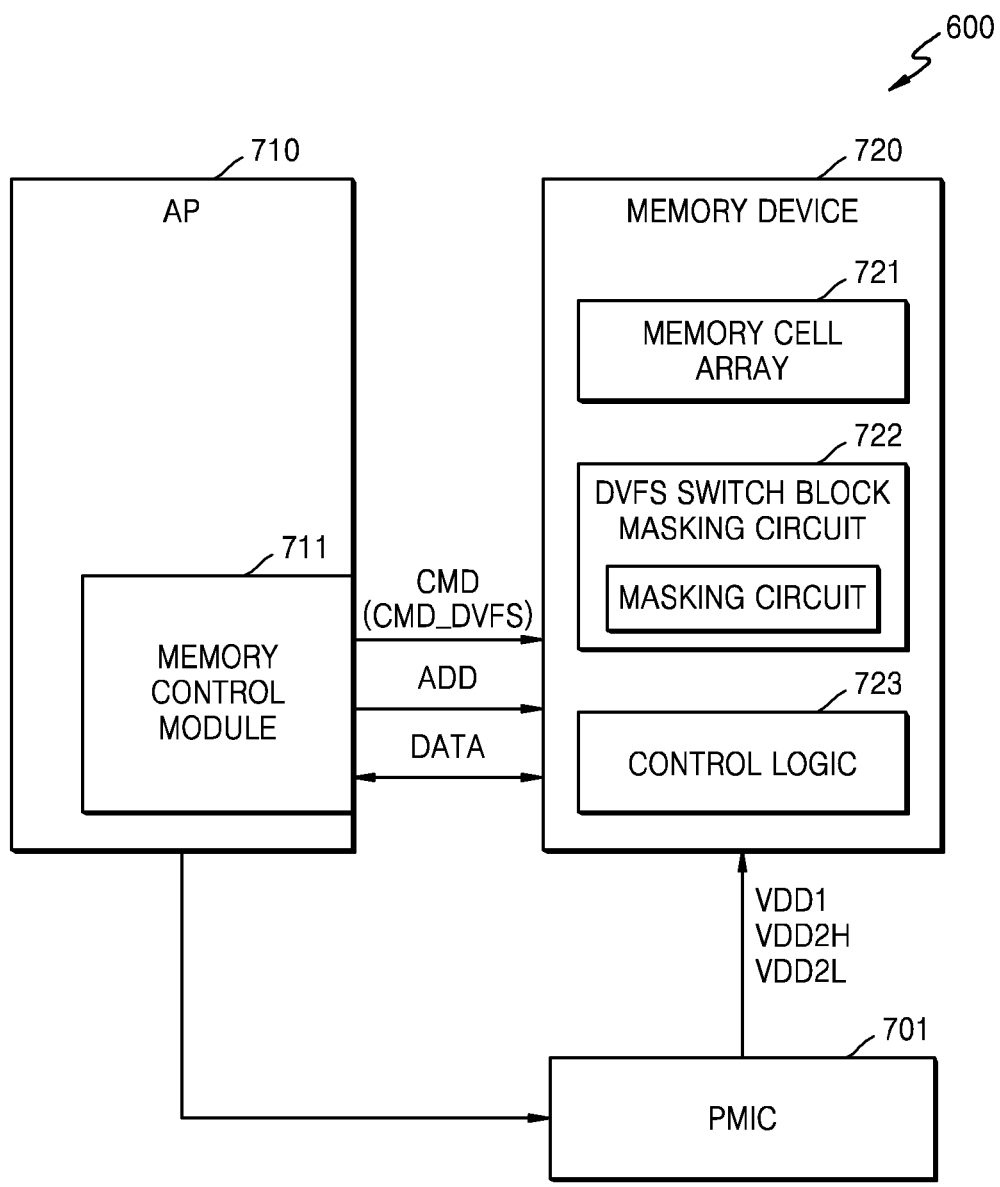
FIG. 15 is a block diagram illustrating a memory system according to another embodiment.

FIG. 15 is a block diagram illustrating another exemplary memory system. In FIG. 15, a data processing system 600 including an application processor 710 and a memory device 720 is illustrated and a memory control module 711 in the application processor 710 and the memory device 720 may configure a memory system. Specifically, the memory control module 711 may communicate a command CMD, address ADD, and data DATA to the memory device 720. In addition, the memory device 720 may include a memory cell array 721, a DVFS switch block 722, and a control logic 723. In addition, the data processing system 600 may further include a PMIC 701. The PMIC 701 may provide the second high-power voltage VDD2H, the second low-power voltage VDD2L, and the first power voltage VDD1 to the memory device 720.

The application processor 710 may be implemented by a system on chip SoC. The system on chip SoC may include a system bus (not shown) to which a protocol having a predetermined standard bus specification is applied and may include various intellectual properties (IP) connected to the system bus. As a standard specification of the system bus, an advanced microcontroller bus architecture (AMBA) protocol of an advanced RISC machine (ARM) may be applied. A bus type of the AMBA protocol may be an advanced high-performance bus (AHB), an advanced peripheral bus (APB), an advanced extensible interface (AXI), AXI4, or AXI coherency extensions (ACE). Other than the above protocols, another type of protocol such as uNetwork of SONICs Inc, CoreConnect of IBM, or an open core protocol of OCP-IP may be applied.

The memory device 720 may perform various operations related to the DVFS function according to the above-described embodiments. For example, the memory device 720 performs an internal switching operation in response to a DVFS command CMD_DVFS from the memory control module 711 so that the second high-power voltage VDD2H or the second low-power voltage VDD2L may be selectively provided to the various circuit blocks provided in the memory device 720 in accordance with an operation mode.

On the other hand, the DVFS switch block 722 may include the DVFS switches according to the above-described embodiments and may include a masking circuit arranged to correspond to at least one DVFS switch. In the initial driving period of the memory device 620, the DVFS switch block 722 may be controlled in accordance with control from the memory control module 711 so that at least one DVFS switch maintains a turn on state in the initial driving period. Therefore, it is possible to reduce a probability of generating the peak current.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. A memory device comprising:
 a first switch that switches a first power voltage and transmits the first power voltage to a common node of a first power rail;
 a second switch that switches a second power voltage and transmits the second power voltage to the common node;
 a control logic that generates a first control signal for controlling the first switch during initial driving of the memory device; and
 a masking circuit that controls the first switch to maintain a turn on state in at least a partial period of an initial driving period of the memory device by providing a first masking control signal obtained by masking the first control signal to the first switch.

2. The memory device of claim 1, wherein the first power voltage has a higher level than the second power voltage.

3. The memory device of claim 1, wherein:
the first power voltage is VDD2H defined by a low power double data rate (LPDDR) specification and the second power voltage is VDD2L defined by the LPDDR specification,
the first switch is a first dynamic voltage and frequency scaling (DVFS) switch for switching the VDD2H for a DVFS function, and
the second switch is a second DVFS switch for switching the VDD2L for the DVFS function.

4. The memory device of claim 1, wherein:
the first switch comprises a p-type metal-oxide-semiconductor (PMOS) transistor and the first masking control signal is applied to a gate electrode of the PMOS transistor, and
the first masking control signal maintains a logic low state in the initial driving period.

5. The memory device of claim 4, wherein:
the control logic provides a first internal control signal to the masking circuit and the first internal control signal maintains a logic low state in the initial driving period, and
the masking circuit comprises:
a NAND gate logic that receives the first internal control signal and the first control signal and generates a first output signal; and
a first inverter that generates a second output signal obtained by inverting the first output signal from the NAND gate logic and provides the second output signal to the first switch as the first masking control signal.

6. The memory device of claim 5, wherein the masking circuit further comprises a second inverter that generates a third output signal obtained by inverting the second output signal and provides the third output signal as a second control signal for controlling the second switch.

7. The memory device of claim 1, wherein the control logic further generates a second control signal for controlling the second switch during initial driving of the memory device.

8. The memory device of claim 1, wherein:
each of the first switch and the second switch comprises a p-type metal-oxide-semiconductor (PMOS) transistor and the first power voltage has a higher level than the second power voltage, and
the first power voltage is applied as a bulk voltage of each of the first switch and the second switch.

9. The memory device of claim 1, wherein:
the memory device receives the first power voltage and the second power voltage from an external power management integrated circuit (PMIC), and
the second power voltage is provided to the memory device after predetermined delay in comparison with the first power voltage.

10. A memory device that receives a first power voltage VDD1, a second high-power voltage VDD2H, and a second low-power voltage VDD2L in accordance with a low power double data rate (LPDDR) specification, the memory device comprising:
a first dynamic voltage and frequency scaling (DVFS) switch connected between a first power rail that transmits the second high-power voltage VDD2H and a second power rail that transmits at least two power voltages in accordance with a DVFS function;
a second DVFS switch connected between a third power rail that transmits the second low-power voltage VDD2L and the second power rail; and
a masking circuit that receives a first DVFS control signal for controlling the first DVFS switch in an initial driving period of the memory device, masks the first DVFS control signal, and provides a first masking DVFS control signal for turning on the first DVFS switch in the initial driving period to the first DVFS switch.

11. The memory device of claim 10, further comprising a control logic that generates the first DVFS control signal and a first internal control signal used for masking processing in the initial driving period of the memory device.

12. The memory device of claim 11, wherein:
the first DVFS switch comprises a first metal-oxide-semiconductor (MOS) transistor and the second DVFS switch comprises a second MOS transistor, and
the masking circuit provides the first masking DVFS control signal to a gate electrode of the first MOS transistor.

13. The memory device of claim 12, wherein the masking circuit comprises:
a NAND gate logic that receives the first internal control signal and the first DVFS control signal and performs a NAND operation to generate a first output signal; and
a first inverter that generates a second output signal obtained by inverting the first output signal from the NAND gate logic and provides the second output signal to a gate electrode of the first MOS transistor as the first masking DVFS control signal.

14. The memory device of claim 13, wherein the masking circuit further comprises a second inverter that generates a third output signal obtained by inverting the second output signal and provides the third output signal to a gate electrode of the second MOS transistor as a second DVFS control signal.

15. The memory device of claim 13, wherein:
the first internal control signal has a waveform that maintains a logic low state in the initial driving period, and
the second output signal maintains a logic state for turning on the first MOS transistor in the initial driving period.

16. The memory device of claim 12, wherein the second high-power voltage VDD2H is applied as a bulk voltage of the second MOS transistor.

17. A method of operating a memory device, wherein:
the memory device receives a first power voltage VDD1, a second high-power voltage VDD2H, and a second low-power voltage VDD2L in accordance with a low power double data rate (LPDDR) specification, and
the memory device comprises a first dynamic voltage and frequency scaling (DVFS) switch that transmits the second high-power voltage VDD2H to a first power rail and a second DVFS switch for transmitting the second low-power voltage VDDD2L to the first power rail, the method comprising:
generating a first DVFS control signal that controls the first DVFS switch in an initial driving period of the memory device;
generating a first internal control signal that masks the first DVFS control signal in the initial driving period;
generating a first masking DVFS control signal that uniformly maintains a first logic state by performing an operation on the first DVFS control signal and the first internal control signal; and
maintaining a turn on state of the first DVFS switch in the initial driving period in response to the first masking DVFS control signal.

18. The method of claim 17, further comprising:
generating a second DVFS control signal that controls the second DVFS switch; and
maintaining a turn off state of the second DVFS switch in response to the second DVFS control signal in the initial driving period.

19. The method of claim 17, wherein:
each of the first DVFS switch and the second DVFS switch comprises a p-type metal-oxide-semiconductor (PMOS) transistor, and
the generating of the first masking DVFS control signal comprises:
performing a NAND operation on the first internal control signal, which maintains the first logic state in the initial driving period, and the first DVFS control signal; and
generating the first masking DVFS control signal that maintains the first logic state by performing an inversion operation on a result of the NAND operation.

20. The method of claim 17, further comprising injecting charges into a capacitance component that exists in a node of the first power rail connected to the first DVFS switch in the initial driving period as a turn on state of the first DVFS switch is maintained.

\* \* \* \* \*